(12) United States Patent
Song et al.

(10) Patent No.: US 8,080,349 B2
(45) Date of Patent: Dec. 20, 2011

(54) EXPOSURE MASK AND METHOD FOR MANUFACTURING SEMICONDUCTOR DEVICE USING THE SAME

(75) Inventors: Joo Kyoung Song, Icheon-si (KR); Hyoung Soon Yune, Seoul (KR)

(73) Assignee: Hynix Semiconductor, Inc., Icheon (KR)

( * ) Notice: Subject to any disclaimer, the term of this patent is extended or adjusted under 35 U.S.C. 154(b) by 191 days.

(21) Appl. No.: 12/495,537

(22) Filed: Jun. 30, 2009

(65) Prior Publication Data

US 2010/0159701 A1    Jun. 24, 2010

(30) Foreign Application Priority Data

Dec. 19, 2008  (KR) .................. 10-2008-0130105

(51) Int. Cl.
*G03F 1/00* (2006.01)
*G03F 7/00* (2006.01)
(52) U.S. Cl. .......................................... 430/5; 430/311
(58) Field of Classification Search ............... 430/5, 311
See application file for complete search history.

(56) References Cited

U.S. PATENT DOCUMENTS

| 5,965,302 | A | * | 10/1999 | Horikawa et al. ................. 430/5 |
| 2002/0006734 | A1 | * | 1/2002 | Imai et al. ..................... 438/735 |
| 2004/0023132 | A1 | | 2/2004 | Akiyama | |
| 2008/0239272 | A1 | * | 10/2008 | Wang et al. ..................... 355/70 |

FOREIGN PATENT DOCUMENTS

| JP | 06-313964 A | 11/1994 |
| KR | 1020000054949 A | 9/2000 |
| KR | 1020060020300 A | 3/2006 |
| KR | 1020060052324 A | 5/2006 |

* cited by examiner

*Primary Examiner* — Stephen Rosasco
*Assistant Examiner* — Stewart Fraser

(57) ABSTRACT

A method for manufacturing a semiconductor device comprises performing an exposing and developing process using an exposure mask including shading patterns and assistant patterns arranged in parallel to the shading patterns to prevent a scum phenomenon generated when a main pattern is formed in a cell region over a semiconductor substrate, thereby improving characteristics, reliability and yield of the semiconductor device. As a result, the method enables high-integration of the semiconductor device.

13 Claims, 4 Drawing Sheets

EXPOSURE MASK AND METHOD FOR MANUFACTURING SEMICONDUCTOR DEVICE USING THE SAME

CROSS-REFERENCE TO RELATED APPLICATION

The present application claims priority to Korean patent application No. 10-2008-0130105 filed Dec. 19, 2008, the disclosure of which is hereby incorporated in its entirety by reference.

BACKGROUND OF THE INVENTION

The present invention generally relates to an exposure mask and a method for manufacturing a semiconductor device using the same. More specifically, the present invention relates to an exposure mask that can be used in high integration of semiconductor devices and a method for manufacturing a semiconductor device using the same.

Due to development of manufacturing technologies of semiconductor devices, the size of a unit element, e.g., a transistor becomes smaller, and integration of semiconductor devices is increased. In order to develop a highly integrated semiconductor memory device, it is important to reduce the chip size.

In the case of Dynamic Random Access Memory (DRAM) devices, various different methods are used to reduce the chip size. For example, the cell structure is changed, and more specifically, the plane arrangement or layout of active regions is changed.

The general layout of current active regions is an 8F2 structure. The 8F2 structure includes an active region that has a major axis in a horizontal direction and two word lines arranged in parallel to a minor axis of the active region. In the 8F2 structure, the arrangement of the active regions is changed so that the unit cell size may be reduced although the same minimum critical dimension F is applied.

In a DRAM cell that has a folded bit line structure, the 8F2 structure selects one of the two word lines to read data of a cell transistor through one bit line and one sense amplifier (SA).

In the 8F2 layout of the DRAM cell, a space between the active regions is 3F, and it is easy to secure a margin. However, this results in the cell area being increased.

In order to reduce the cell area to smaller than that of the 8F2 layout, an open bit line cell arrangement structure has been developed. When the DRAM cell structure is changed from the 8F2 structure to a 6F2 structure, the cell size is decreased and the chip size is reduced so as to increase the wafer yield. However, a design rule is gradually reduced so that a space between active regions of a semiconductor device is made smaller. As a result, it becomes more difficult to use a photolithography process using a general exposure mask. In order to avoid such a photolithography issue, an assistant feature is formed in a cell edge of the exposure mask to form a device having a reduced design rule.

FIG. 1 is a plane diagram illustrating an edge portion of a conventional exposure mask. FIG. 2 is a plane diagram illustrating a semiconductor device formed using the exposure mask of FIG. 1.

Referring to FIG. 1, the conventional exposure mask comprises shading patterns and assistant features. FIG. 1 shows the edge portion of the exposure mask.

The exposure mask 100 comprises a first region 100A including shading patterns 110 and a second region 100B including assistant features 120. The shading patterns 110 disposed in the first region 100A define photoresist patterns (not shown) of a cell region formed over a semiconductor substrate using photolithography. Hereinafter, the first region 100A of the exposure mask 100 refers to a region where patterns are disposed to define photoresist patterns (not shown) disposed in the cell region of the semiconductor substrate.

The assistant features 120 disposed in the second region 100B are not transferred to the semiconductor substrate after the photolithography. The assistant features 120 are, rather, used to facilitate formation of line patterns of the cell region. It is because the assistant feature 120 reduces optical proximity effect of the light transmitted formed on the cell region. The second region 100B of the exposure mask 100 refers to a region where the assistant patterns 120 are disposed to facilitate formation of patterns in the cell region of the semiconductor substrate.

The shading pattern 110 has an oblique line shape. More specifically, the shading pattern 110 includes a plurality of line-shaped patterns having an X-axis as a major axis arranged obliquely for optical proximity correction (OPC). The assistant feature 120 has line-shaped patterns having a Y-axis as a major axis. The assistant feature 120 has a width (S1) between line-shaped patterns that is larger than a width (L1) of the line-shaped patterns.

As shown in FIG. 2, a main pattern 210 is transferred onto a semiconductor substrate 200 by using the exposure mask of FIG. 1 having the shading patterns 110 in a photolithography process. The first region 100A of FIG. 1 corresponds to the cell region of the semiconductor substrate. The assistant feature 120 disposed in the second region 100B of FIG. 1 is exposed over the region adjacent to the cell region the semiconductor substrate. As a result, only the main pattern 210 is patterned over the semiconductor substrate. Since the assistant feature 120 has a critical dimension less than resolving power, as result, only a main pattern 210 is pattered on the semiconductor substrate.

A scum 220 having a band type is formed in the edge of the main pattern 210. The scum 220 is generated when the assistant feature 120 disposed in the second region 100B of the exposure mask 100 cannot compensate the optical proximity correction accurately. That is, the assistant feature 120 is not exposed like the shading pattern 110 disposed in the first region 100A of the exposure mask 100, so that the scum 220 is generated in the edge of the main pattern 210. As a result, it is difficult to transfer the shading pattern 110 disposed in the first region 100A of the exposure mask 100 onto the substrate 200 as the shading pattern 120.

BRIEF SUMMARY OF THE INVENTION

Various embodiments of the invention are directed to providing a method for manufacturing a semiconductor device with an exposure mask that comprises shading patterns disposed in parallel to assistant features in which a pitch is regularly formed.

According to an embodiment of the present invention, an exposure mask comprises: line-shaped shading patterns; and assistant features (AF) wherein the line-shaped shading patterns and the assistant features have substantially the same slope.

Preferably, the line-shaped shading patterns may include a line pattern and a space pattern.

Preferably, each of the line-shaped shading patterns may have substantially the same critical dimension.

Preferably, the line-shaped shading patterns may be arranged obliquely in a first region corresponding to a cell region of a semiconductor device.

Preferably, the assistant features may be arranged in a second region corresponding to the region adjacent of the cell region.

Preferably, the second region may have a width (B1) ranging from 0.5 to 50 μm.

Preferably, the second region may have a width (B1) ranging from 1 to 10 μm.

Preferably, the assistant features may include a line pattern and a space pattern.

Preferably, the assistant features may include a line pattern and a space pattern each that have a regular pitch.

Preferably, each of the line pattern and the space pattern may have the same critical dimension.

Preferably, the line pattern may include a first line pattern, a space pattern and a second line pattern.

Preferably, the first line pattern or the second line pattern, or both, has a smaller critical dimension than that of the shading pattern.

Preferably, the line-shaped shading pattern is formed to have the same pitch as that of the assistant feature.

According to another embodiment of the present invention, an exposure mask comprises: line-shaped oblique shading patterns; and assistant features (AF) wherein the line-shaped oblique shading patterns and the assistant features have substantially the same slope.

Preferably, the line-shaped oblique shading pattern and the assistant features may have substantially the same pitch.

According to an embodiment of the present invention, the method for manufacturing a semiconductor device comprises: forming a hard mask layer over a semiconductor substrate; and etching the hard mask layer with an exposure mask including line-shaped shading patterns and assistant features wherein the line-shaped shading patterns and the assistant features have substantially the same slope.

Preferably, the line-shaped shading patterns and the assistant features are formed to have the substantially same pitch.

Preferably, each of the line-shaped shading patterns is formed to have substantially the same critical dimension.

Preferably, each of the assistant features is formed to have substantially the same critical dimension.

According to another embodiment of the present invention, a method for manufacturing a semiconductor device comprises: forming a hard mask layer over a semiconductor substrate; etching the hard mask layer with an exposure mask including line-shaped shading patterns and assistant features wherein the line-shaped shading patterns and the assistant features have substantially the same slope; etching the hard mask layer with an exposure mask to form a hard mask pattern; etching the semiconductor substrate with the hard mask pattern as a mask to form a trench; and forming a device isolation film by filling the trench.

DESCRIPTION OF EMBODIMENTS

Figure 1:
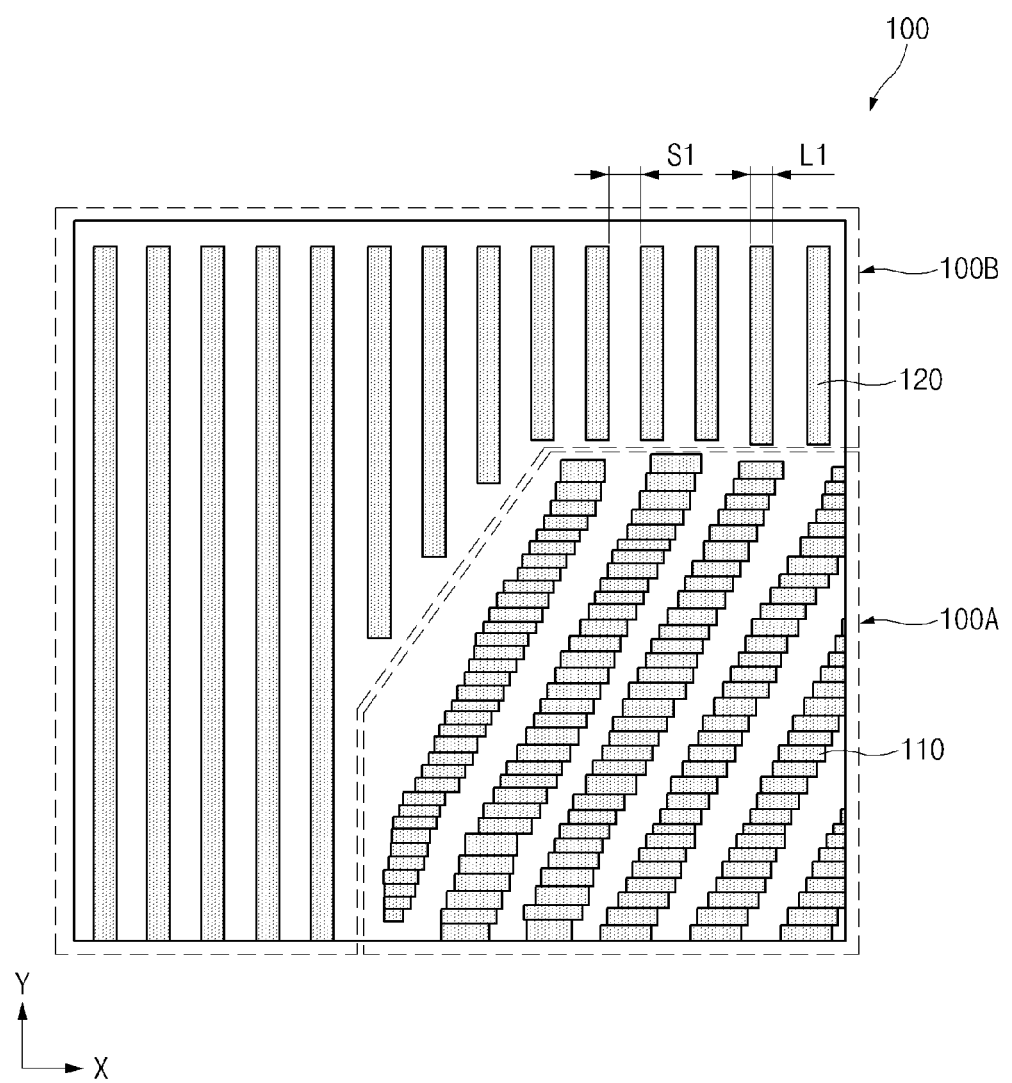
FIGS. 1 and 2 are diagrams illustrating a conventional exposure mask and a semiconductor device formed by using the same.
Figure 2:
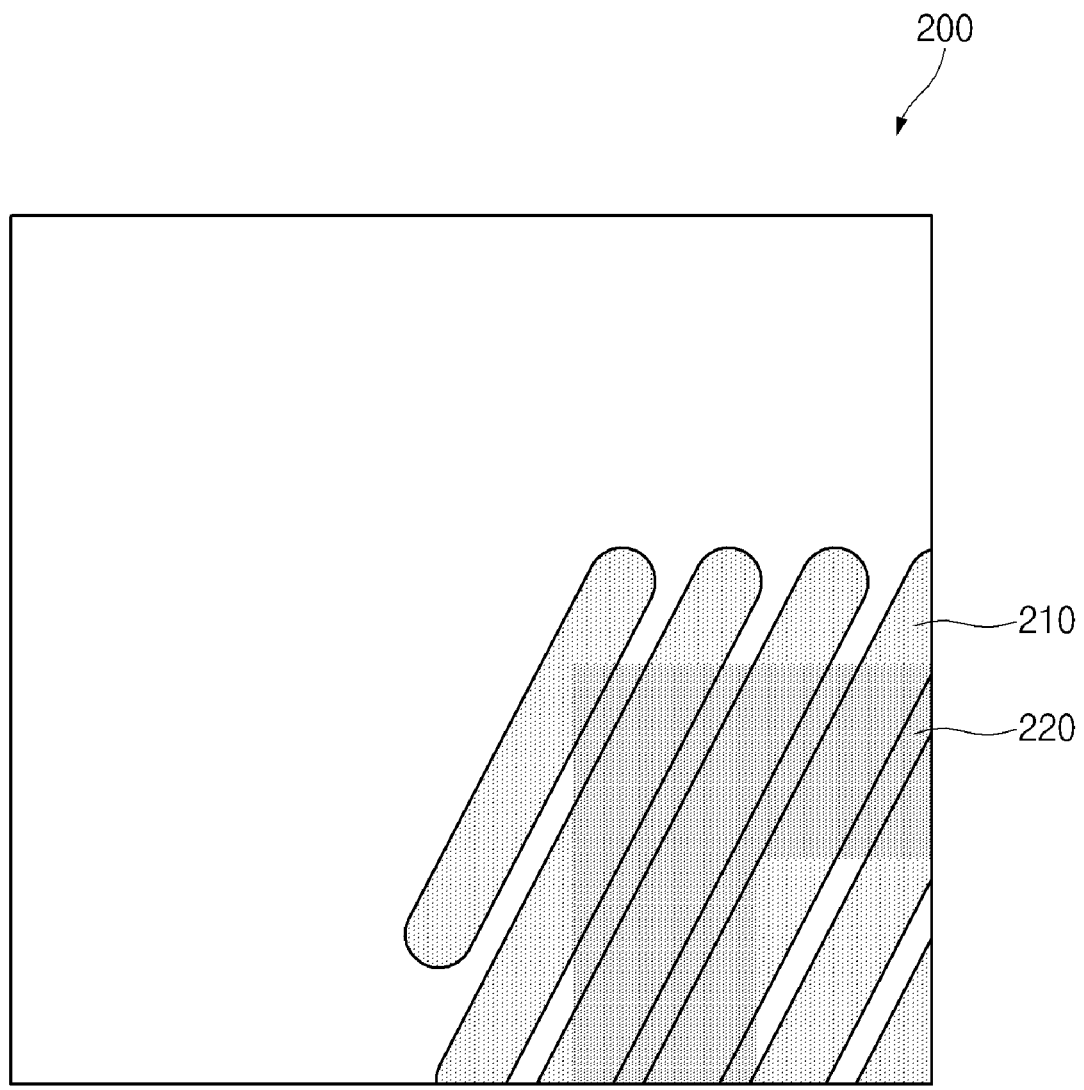
Figure 3:
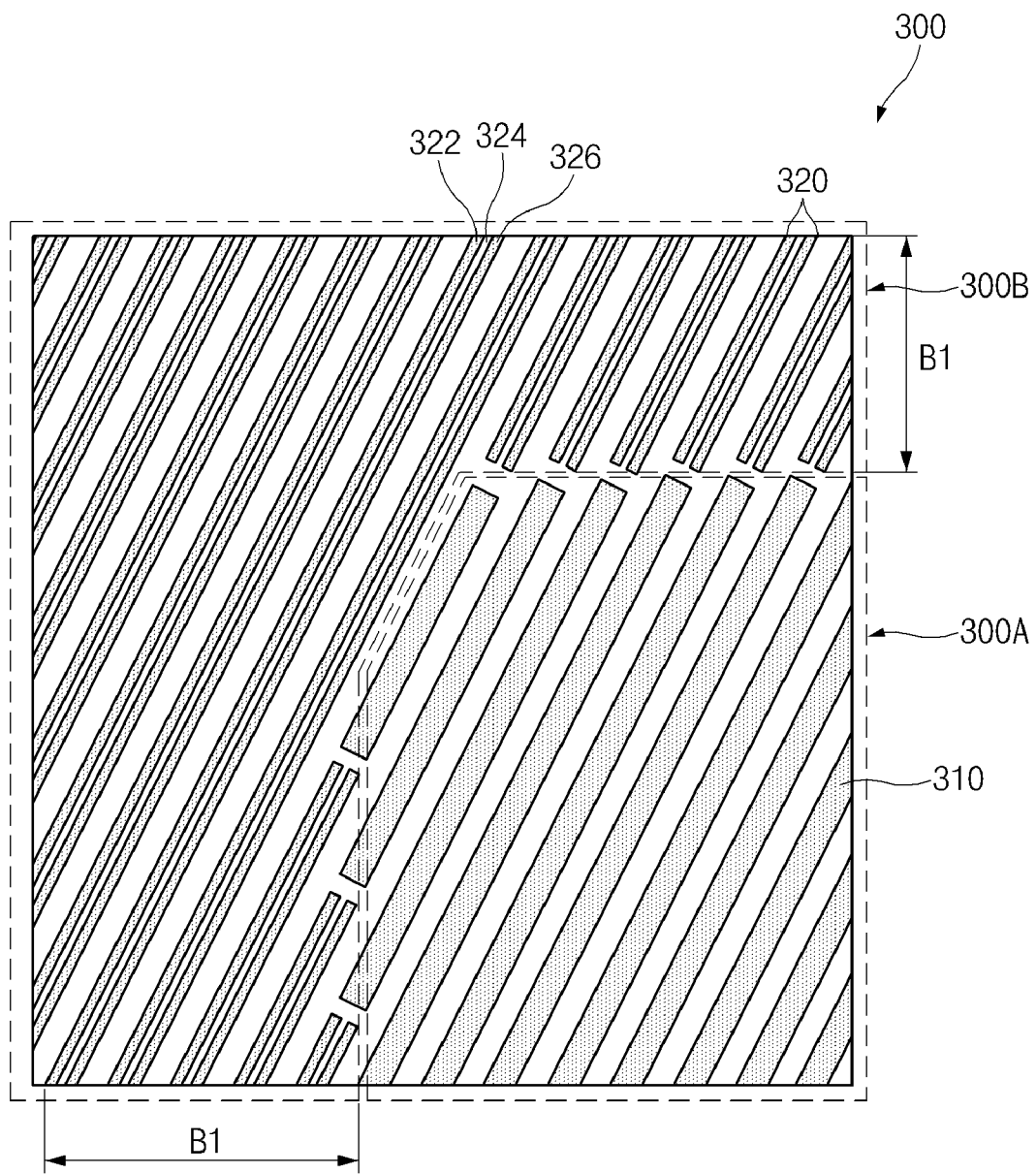
FIGS. 3 and 4 are diagrams illustrating an exposure mask and a semiconductor device formed by using the same according to an embodiment of the present invention.
Figure 4:
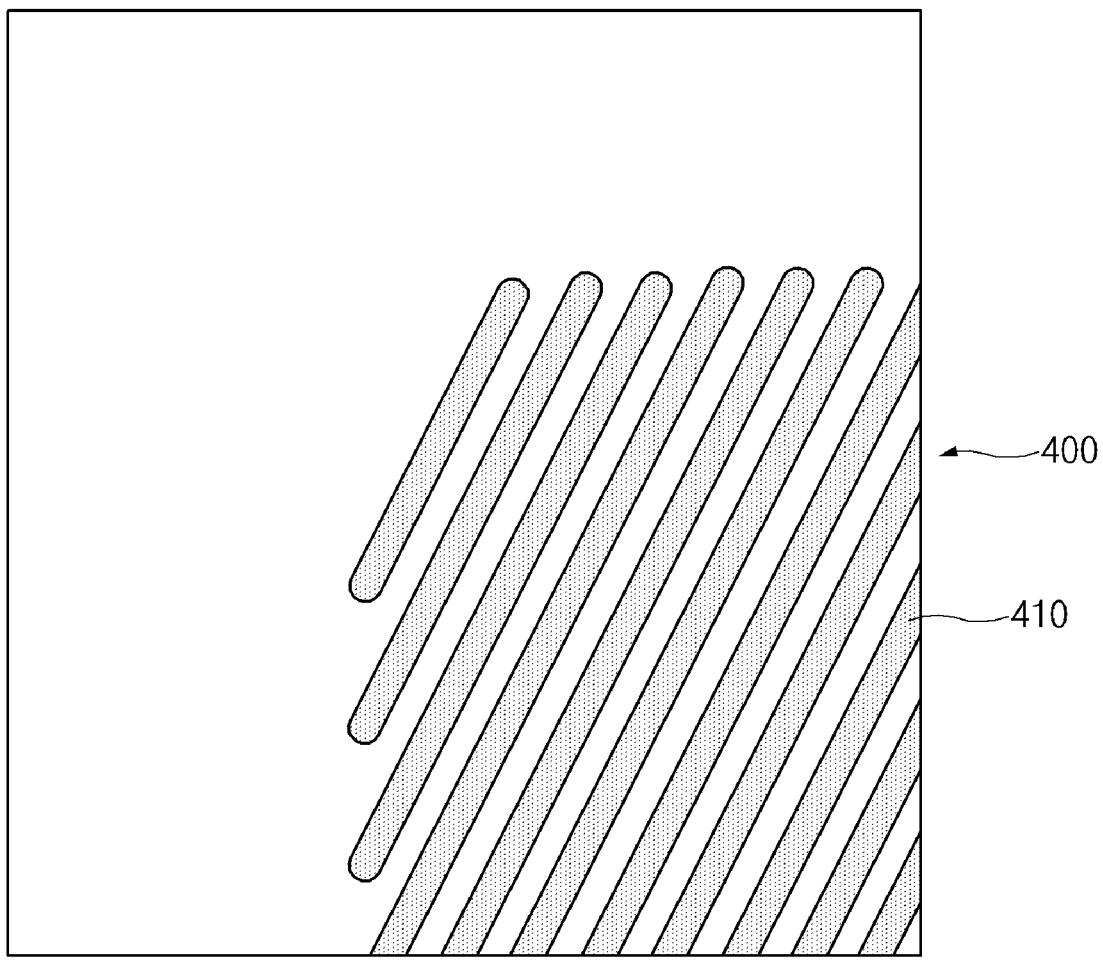

FIGS. 3 and 4 are diagrams illustrating an exposure mask and a semiconductor device formed by using the same according to an embodiment of the present invention.

Referring to FIG. 3, an exposure mask 300 of the present invention comprises shading patterns 310 disposed in a first region 300A and assistant features 320 disposed in a second region 300B. The first region 300A is associated with the cell region, and the second region 300B is associated with the region adjacent to the cell region. The shading patterns 310 of the first region 300A are arranged as oblique lines that are spaced apart from each other. The oblique lines are substantially parallel to each other (i.e., have substantially the same slope). The assistant features 320 are arranged generally in parallel to the shading patterns 310 in the second region 300B in the present embodiment.

The shading pattern 310 is formed with an oblique line pattern from one end portion to the other end portion. Preferably, the line and space pattern has a regular pitch. The line pattern and the space pattern have substantially the same critical dimension. The same critical dimension of the line pattern and the space pattern is easily to patterning the line pattern.

The assistant patterns 320 are formed with line and space patterns in parallel to the shading patterns 310. The assistant pattern 320 neighboring with the end portion of the shading pattern 310 is separated by a given distance from the shading pattern 310. The width (B1) of the second region 300B ranges from 0.5 to 50 μm, preferably from 1 to 10 μm. Preferably, the line and space pattern of the assistant pattern 320 have the same critical dimension.

Each assistant feature 302 comprises of at least one line-shaped pattern. In the present embodiment, each assistant feature has two line-shaped patterns that have substantially the same slope. For example, the line pattern of the assistant feature 320 includes a first line pattern 322, a space pattern 324 and a second line pattern 326. When the line pattern of the assistant pattern 320 has a critical dimension of 1F, each of the first line pattern 322, the space pattern 324 and the second line pattern 326 has a critical dimension of 1/3 F.

As describe in the foregoing, the assistant feature 320 has the same shape and width as the shading pattern 320, thereby reducing optical proximity effect of the light transmitted from the cell region and forming the shading pattern 310 without being distorted.

FIG. 4 shows a photoresist pattern formed over a semiconductor substrate using the exposure mask of FIG. 3. The shading pattern 310 disposed in the first region 300A of the exposure mask 300 of FIG. 3 defines a main pattern 410 formed to be oblique over a semiconductor substrate 400. The assistant feature 320 disposed in the second region 300B of the exposure mask 300 of FIG. 3 is not exposed and developed over the semiconductor substrate 400, but facilitates formation of the main pattern 410. The assistant feature 320 of the second region 300B includes the first line pattern 322, the space pattern 324 and the second line pattern 326. The assistant feature 320 is arranged in parallel to the shading pattern 310 of the first region 300A, thereby accurately compensating an optical proximity effect of the shading pattern 310 to prevent generation of scum.

In another embodiment of the present invention, a semiconductor substrate is etched with a main pattern defined by an exposure mask of the present invention as an etching mask to form a trench. Then, a device isolation film that fills the trench is formed to define an active region, thereby obtaining a semiconductor device.

In still another embodiment of the present invention, a semiconductor device can be applied in an exposure mask of all portions where an island-shaped or line-shaped pattern is formed. An exposure mask for etching may be applied in a method for manufacturing a semiconductor device that comprises an island-shaped or line-shaped pattern formed over a semiconductor substrate. The exposure mask for etching enables patterning of a desired pattern. That is, the exposure mask for etching includes transparent patterns arranged in a region where a pattern is removed, that is, in a region which does not require to be patterned.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. An exposure mask comprising:
line-shaped shading patterns; and
assistant features (AF) wherein the line-shaped shading patterns and the assistant features have substantially the same slope,
wherein the assistant features each include a line pattern and a first space pattern that have substantially the same pitch, and wherein the line pattern includes a first line pattern, a second space pattern, and a second line pattern.

2. The exposure mask according to claim 1, wherein the line-shaped shading patterns include a line pattern and a third space pattern.

3. The exposure mask according to claim 1, wherein each of the line-shaped shading patterns has substantially the same critical dimension.

4. The exposure mask according to claim 1, wherein the line-shaped shading patterns are arranged obliquely in a first region corresponding to a cell region of a semiconductor device.

5. The exposure mask according to claim 4, wherein the assistant features are provided in a second region corresponding to the region adjacent to the cell region.

6. The exposure mask according to claim 5, wherein the second region has a width of 0.5 to 50 μm.

7. The exposure mask according to claim 5, wherein the second region has a width of 1 to 10 μm.

8. The exposure mask according to claim 1, wherein each of the line pattern and the first space pattern has the same critical dimension.

9. The exposure mask according to claim 1, wherein the first line pattern or the second line pattern, or both, has a smaller critical dimension than that of the line-shaped patterns.

10. The exposure mask according to claim 1, wherein the line-shaped shading patterns are formed to have substantially the same pitch as that of the assistant features.

11. An exposure mask comprising:
line-shaped oblique shading patterns; and
assistant features (AF) wherein the line-shaped oblique shading patterns and the assistant features have substantially the same slope,
wherein the assistant features each include a line pattern and a first space pattern that have substantially the same pitch, and wherein the line pattern includes a first line pattern, a second space pattern, and a second line pattern.

12. The exposure mask of claim 11, wherein the line-shaped oblique shading patterns and the assistant features have substantially the same pitch.

13. An exposure mask comprising:
line-shaped shading patterns arranged along a first direction; and
assistant features (AF) arranged adjacent to the line-shaped shading patterns along the first direction, wherein each assistant feature includes a first assistant line pattern arranged along the first direction, a second assistant line pattern parallel to the first assistant line pattern, and a space pattern between the first and the second assistant line pattern,
wherein each line-shaped shading pattern has a pattern width F and neighboring line-shaped patterns are spaced apart from each other by a distance substantially the same as F, wherein the assistant patterns each has a pattern width substantially the same as F and neighboring assistant features are spaced apart from each other by a distance substantially the same as F, wherein each of the first assistant line pattern, the second assistant line pattern, and the space pattern of each assistant feature has a pattern width of F/3, and wherein the width F is a pattern size resolvable under a given photolithography condition, and the F/3 is a pattern size non-resolvable under the given photolithography condition.

* * * * *